United States Patent [19]

Kantorowicz

[11] 3,953,836

[45] Apr. 27, 1976

[54] ACOUSTIC STORAGE DEVICE FOR HIGH-FREQUENCY ELECTRICAL SIGNALS

[75] Inventor: Gerard Kantorowicz, Paris, France

[73] Assignee: Thomson-CSF, Paris, France

[22] Filed: Dec. 13, 1974

[21] Appl. No.: 532,597

[30] Foreign Application Priority Data

Dec. 18, 1973 France .................. 73.45234

[52] U.S. Cl. .................. 340/173 MS; 340/173.2; 340/173 R
[51] Int. Cl.² .................. G11C 21/02; G11C 11/22
[58] Field of Search ....... 340/173 R, 173 MS, 173.2

[56] References Cited
UNITED STATES PATENTS 3,145,372  8/1964  Suits .......................... 340/173 MS

*Primary Examiner*—Terrell W. Fears
*Attorney, Agent, or Firm*—Roland Plottel

[57] ABSTRACT

The present invention relates to a storage device for high-frequency electrical signals.

In the units employed for the storage of electrical signals and consisting of a capacitor in series with a diode constituted by an insulated electrode 10 applied to a semi-conductive substrate marked 3 arranged between the electrodes 2, 5, the invention utilises the piezo-electric substance 40 coupled to a transducer 7 to which they are applied the electrical signals for storage, and a network of diodes applied in the variant embodiment shown in the figure, to said substance and aligned in the direction of propagation of the acoustic waves. Voltage of opposite direction are alternately applied between the electrodes to effect storage and to effect read-out of the signal.

Application to radio frequencies of the order of 100 MHz.

5 Claims, 6 Drawing Figures

ACOUSTIC STORAGE DEVICE FOR HIGH-FREQUENCY ELECTRICAL SIGNALS

The present invention relates to a storage device for high-frequency electrical signals.

One known method of storing an electrical signal occuring in the form of a voltage, is that described hereinafter.

An elementary unit is created by arranging in series a capacitor and a diode, for example a Schottky diode, formed by a doped semi-conductor substrate to which an insulated electrode has been applied. Another electrode is applied to an insulator covering the semi-conductor and the former electrode; finally, a contact electrode covering that face of the semi-conductor opposite to the one at which the first electrode is arranged, completes the unit. The two electrodes arranged at either side of the insulating layer constitute the electrodes of the capacitor which is in series with the diode.

For an n-doped semi-conductor whose negatively charged free charge carriers are constituted by electrons, a positive voltage V applied at a given instant between the contact electrode and the second of the aforementioned electrodes, will give rise to the displacement of free electrons towards the insulated electrode which will develop a charge as a consequence; the charging time constant depends upon the substrate conductivity and can be very short if said conductivity is high. The voltage V' developed across the terminals of the capacitor at the end of a given time which is short compared with said time constant, is proportional to the voltage V.

For a p-doped semi-conductor, rather than the n-doped type assumed previously, the same charging phenomenen occurs for an applied voltage which is of opposite sense to the one previously described.

When the applied voltage is removed, the insulated electrode is charged to the voltage V' developed across the terminals of the capacitor. The diode is then reverse-biased; the capacitor discharges across the diode which is arranged in series with it and has a very high resistance because of its reverse bias state.

Thus, during said phase of operation of the unit, there is held or in other words stored in the unit a voltage proportional to V and to the signal corresponding to V, this during the whole of the discharge time, the time constant of which is determined primarily by the reverse resistance of the diode. Because of the high resistance of the diode, generally, with a unit of this kind, long-term stores are obtained. The storage times can be adjusted by adjusting the characteristics of the diode.

This phase is the phase of recording or read-out.

To place the device in the initial state and make it ready to receive a fresh recording, it is merely necessary to apply between the same electrodes a voltage of opposite sign to the preceding voltage and of sufficient amplitude to exceed the avalanche threshold, in order thus to rapidly discharge the capacitor by the diode reverse current.

The invention utilises units of the kind described hereinbefore in a novel combination, characteristic of the invention, geared to the case of very high frequency signals, i.e. signals in the order of 100 megahertz.

The invention will be better understood from a consideration of the ensuing description and the attached figures.

Figure 1:
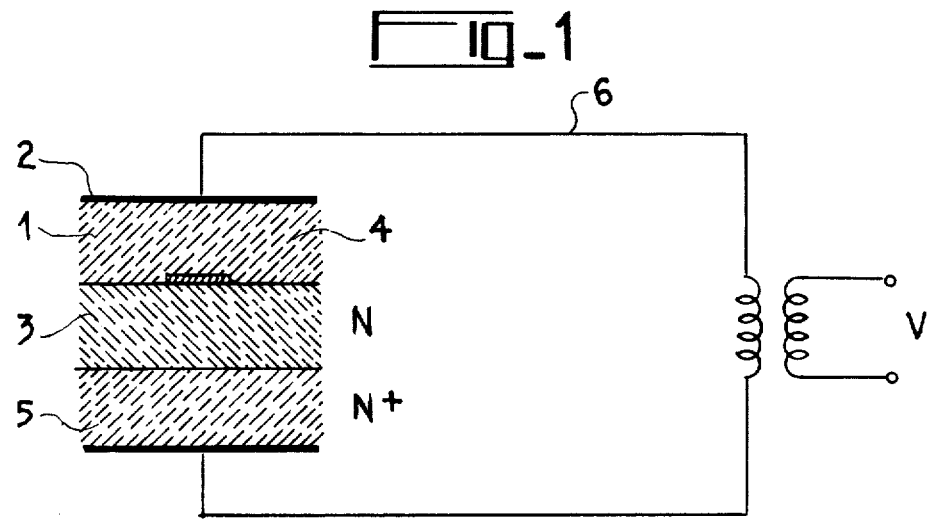
FIG. 1 illustrates the diagram of a storage unit of prior art kind, conforming with the brief description given earlier.

In the FIG. 1 which schematically illustrates a section through the storage unit of prior art kind referred to earlier, 1 is the insulated electrode, a metal plate for example, applied to the semi-conductive substrate, 3 in the figure; this substrate will for example be of n-type silicon, in contact with the contact electrode 5 as indicated in the figure, through an n+ doped zone in order to promote contacting; 2 illustrates the electrode, likewise a metal plate for example applied to the electrically insulating layer 4 which in turn covers the substrate 3 and the insulated electrode 1; 2 and 1 constitute the electrodes of the capacitor of the unit; 6 designates the circuit across whose terminals the signals of voltage V are applied for storage and then read-out. The operation of the unit shown in FIG. 1 is as described earlier.

Figure 2:
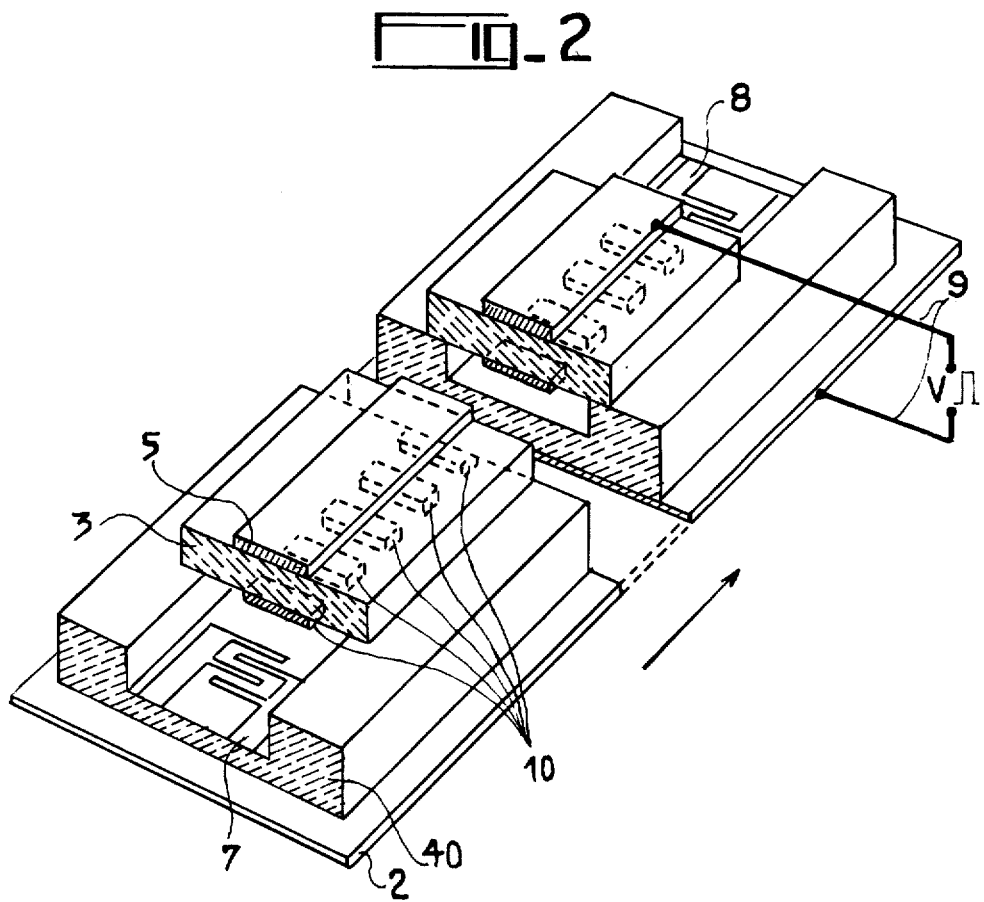
FIG. 2 is an embodiment of the device in accordance with the invention.

FIG. 2 is a perspective view showing a first example of the device in accordance with the invention. In this figure, the elements 3, semi-conductive substrate, and 5, metal contact applied thereon, of the preceding figure are encountered once again, unchanged. There can be seen a network of insulated metal electrodes 10, aligned and regularly spaced, applied to the semi-conductive substrate 3 in the manner of the electrode 1 of the preceding figure, these electrodes performing a similar function to the latter electrode, under the conditions, peculiar to the devices in accordance with the invention, which will be specified hereinafter. Thus, a network of diodes similar to the diode of the preceding figure, is created.

The insulator 4 of the preceding figure is constituted here by a plate of an electrically insulating piezo-electric substance marked 40, this time not with the shape of a wafer of uniform thickness but with the shape shown in the figure, the reason for which will be explained hereinafter. Beneath the plate we once again encounter the electrode 2 of the preceding figure. At one of the ends of the plate 40 and applied thereon, there can be seen a transducer 7 across whose terminals, in operation, there are applied the high frequency signals which are to be stored. In the example illustrated, this transducer is constituted by comb-shaped structures the teeth of which, reduced to two per comb for the sake of clarity, alternate with one another in the manner shown in the drawing, to constitute the usual kind of arrangement. At the other end of the plate 40 there is another transducer 8, similar to the preceding one, the function of which will become apparent. The piezo-electric substance in question consists, for example, of a quartz crystal cut in a given direction in relation to its optical axes.

The device in accordance with the invention shown in FIG. 2, operates in a manner indicated herebelow.

During the recording phase, the high frequency signal for storage having been applied to the transducer 7 and the time required for the acoustic wave corresponding to it to have reached all the diodes in the network having elapsed, the base of the semi-conductive substrate, that is to say the electrode 5, is negatively biased by a voltage pulse of short duration compared with the signal periodicity and applied between the terminals of the connections 9. The diodes of the network are postively biased and rapidly charged to a voltage proportional to the sum of the voltage applied and the voltage corresponding to the high-frequency signal, which voltage is due to the potential wave accompanying the acoustic wave corresponding to the high-frequency signal and propagating at the surface of the plate 40. It is through these potential waves that in the device the presence of a high-frequency signal at the input of the device is manifested in the latter. These waves propagate at the surface of the piezo-electric substance, in the direction of the arrow shown in the figure, which is also the direction of alignment of the insulated electrodes 10 of the diode network.

After the pulse, each diode of the network is charged to a voltage which is the sum of a first, fixed, negative component corresponding to the pulse previously applied, and a second component corresponding to the high-frequency signal propagated by the plate of piezoelectric material 40. This second component has a value which depends upon the potential acting at the surface of the piezo-electric body 40 at the point of insertion of the relevant diode thereon and at the time of application of the voltage pulse. The assembly of these second components, thus reproduces the potential profile existing at the surface of the piezo-electric substance at the instant of application of the pulse and, consequently the high-frequency signal responsible for producing it. The charges accumulated at the insulated electrodes of the diodes then slowly leak away as indicated hereinbefore because of the high resistance of the diode. Storage of the high-frequency signal has taken place. In this final state, the piezo-electric substance is the location of stresses which are due to the stored charges.

Figure 5:
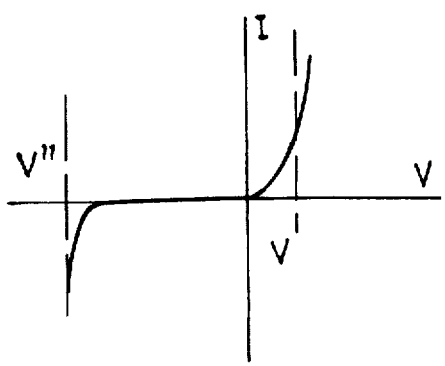
FIG. 5 is a diagram relating to the invention.

During the read-out phase, between the terminals 9 a voltage pulse V'' of short duration and of opposite direction to and higher amplitude than the preceding one, the amplitude being sufficient to cause the diodes to pass a reverse avalanche current, is applied in the manner shown in the diagram of FIG. 5 which plots the current flowing through the unit as a function of the voltage applied across its terminals, and in which V represents the recording voltage and V'' the read-out voltage. Rapid discharge of the capacitors associated with each diode of the network then takes place under the same conditions already indicated earlier.

This discharge cancels out the stresses in the piezoelectric substance 40. This cancelling creates, at the surface of the substance 40, two surface waves propagating in reverse direction. These waves are picked off either at the output transducer 8 or at the input transducer 7 in which latter case time-reversal of the high-frequency signal applied to the transducer 7 is effected.

The distance separating two consecutive insulated electrodes 10, this distance being constant along the network, is chosen of the order of a fraction of the acoustic wave length at the surface of the piezo-electric substance. In order to put this in more concrete terms, it can be mentioned by way of example that in the case of a signal having a frequency of 100 MHz for example and using a piezo-electric substance in which the velocity of propagation is 3 km/s, this wavelength is around 3/100 mm, giving a network of electrodes 10 which is very tightly spaced with an inter-electrode distance of the order of 1/100 mm and a width on the part of the electrodes 10, that is to say their dimension parallel to the direction of propagation, of the same order. This kind of network is produced by one of the known techniques, metallising under vacuum for example. The voltage pulses are of the order of some few volts and have a duration in the order of one nanosecond.

Thus, an acoustic storage device for high frequency electrical signals has been created which does not require the use of an electron beam and, accordingly, need not be operated under vacuum.

In the foregoing, mention has been made of a network of aligned diodes applied individually to the piezo-electric substrate 40; however, this does not imply that they have a common substrate. In the embodiment of FIG. 2 they have been illustrated as belonging to a single semi-conductor bar 3. This represents a variant embodiment which is particularly simple to create.

Similarly, it will be observed that in the example of said same figure, the piezo-electric substance, instead of taking the form of a wafer of uniform thickness, exhibits a central recess. The function of this recess is to avoid contact between the piezo-electric substance and the solid 3 over a major part of that of its surfaces carrying the acoustic waves, which contact would otherwise be likely to produce substantial attenuation of the acoustic waves especially if, as in the case in the figure, the semi-conductive substrate 3 is a one-piece item. This recess has a small depth compared with the wavelength of the acoustic waves.

Figure 6:
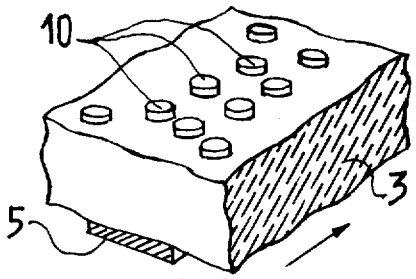
FIG. 6 is a fragmentary view of another variant embodiment of the invention.

In the variant embodiment of the invention, described hereinbefore, the electrodes 10 were aligned and regularly spaced from one another. This arrangement, adopted by way of example, is not obligatory. In another variant embodiment of the invention, the insulated electrodes 10, of arbitrary shape, are distributed in random fashion over the semi-conductive substrate 3 in a manner shown by FIG. 6 of the drawing where these electrodes have a circular form for example.

Electrodes 10 are produced for example by deposition of metal on the substrate 3. Considered in the direction of propagation of the acoustic wave they have a small dimension by comparison with the acoustic wavelength.

Figure 3:
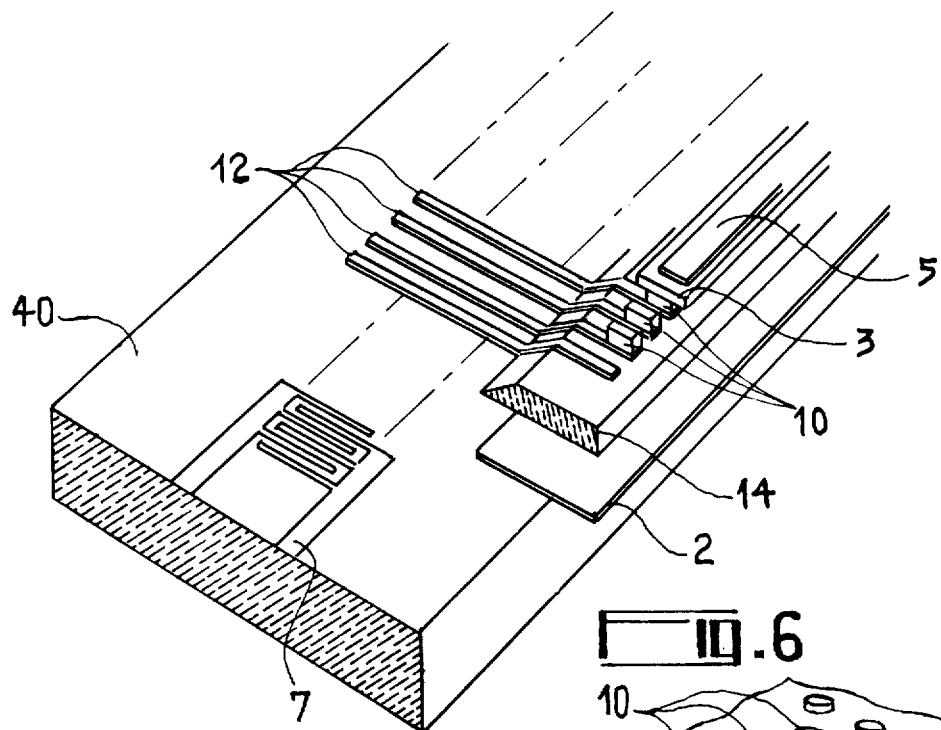
FIG. 3 is a second embodiment of the device in accordance with the invention.
Figure 4:
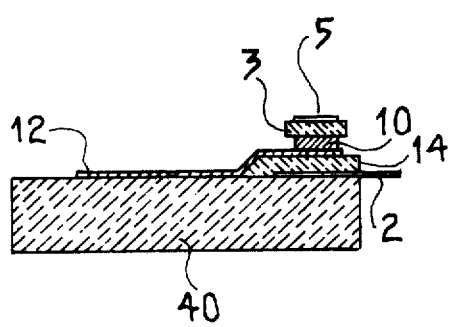
FIG. 4 is an enlarged detail of FIG. 3.

FIG. 3 (FIG. 4 is an enlarged detail thereof) illustrates a perspective view of another embodiment of the invention.

As indicated, the storage duration, that is to say the time for which the recorded signal is held in storage by the device, is fixed by the discharge time constant of the capacitor in series with the diode of each unit. This time depends of course upon the very high resistance presented by the reverse-biased diode but it also depends upon the capacitance of the capacitor. To increase the latter, the thickness of the insulator (40 in FIG. 2) should be reduced; but in the case of the variant embodiment of FIG. 2, one is limited in this approach to a few acoustic wavelengths in order not to affect the propogation of the surface acoustic wave. This difficulty is avoided by the variant embodiment of FIG. 3 where the same references designate the same elements as in FIG. 2. In this variant embodiment, the potential profile is transmitted from the surface of the piezo-electric substance 40 to the insulated electrodes 10 by a network of aprallel conductive bands 12 each in contact with an electrode 10; the reference 14, in this case, designates the one-piece insulating layer of the assembly of units constituted each in the manner shown in FIG. 1 in which latter said layer carried the reference 4; this insulating layer, here, is separate from the piezo-electric substance 40 whereas it was integral therewith in the variant embodiment of FIG. 2; the assembly takes the form shown in perspective in FIG. 3 and in section in FIG. 4. The contact electrode 2 is on the insulating layer 14. In the variant embodiment of FIG. 3, it has been shown, by way of example, in contact also with the piezo-electric substance 40 although said contact may not be necessary in this variant embodiment of the invention, extending as it does equally to the case where the plate 2 is located at a certain interval from the substance 40.

Of course, the invention is not limited to the embodiment described and shown which was given solely by way of example.

What is claimed is:

1. An electro-acoustic storage device for high-frequency signals, constituted by a network of units each made up of a capacitor and a semi-conductor diode in series with one another, said diode being composed of an insulated electrode applied to one of the faces of a semi-conductive substrate and arranged between two electrodes the first of which is applied directly upon that face of said substrate opposite to the one on which said insulated electrode is applied, and the second of which is applied on a layer of an electrical insulating material facing said insulated electrode as well as the corresponding substrate face, said insulated electrode and said second electrode constituting the electrodes of said capacitor, characterised in that it comprises, furthermore, a piezo-electric substance and an input transducer applied upon one of the faces of said substance, to the terminals of which transducer there are applied the signals; in that said insulated electrodes of said network of diodes are distributed in the direction of propagation of the surface acoustic waves generated by said transducer on the face of said piezo-electric substance; and in that it comprises means for coupling that face of said piezo-electric substance at which said acoustic waves propagate, with said insulated electrodes of said diodes of the network, as well as means for alternately applying between said electrodes of each capacitor, a voltage pulse to charge said capacitor up and a voltage pulse of opposite direction in order to cause it to discharge by avalanche effect across said diode, said discharge producing at the terminals of a transducer applied upon the same face of the piezo-electric substance as before, read-out of the signal stored in each of the diodes at the time of charging of the capacitor.

2. An electro-acoustic storage device as claimed in claim 1, characterised in that said layer of electrically insulating material exhibits a piezo-electric effect and the assembly of said layers of the different diodes of the network is constituted by said piezo-electric substance said coupling means consist simply in contact between the semi-conductive substrate of said diodes with that face of the piezo-electric substance upon which said transducers are applied.

3. An electro-acoustic storage device as claimed in claim 2, characterised in that the semi-conductive substrates of the diodes of the network, form one and the same bar.

4. An electro-acoustic storage device as claimed in claim 3, characterised in that said piezo-electric substance comprises a recess at that of its portions located opposited and insulated electrodes.

5. An electro-acoustic storage device as claimed in claim 1, characterised in that said coupling means consist of a network of parallel conductive bands applied, at one of their ends, on that face of the piezo-electric substance at which propagation takes place, and in contact at their other ends in each case with one of said insulated electrodes.

* * * * *